United States Patent [19]

Nitta et al.

[11] Patent Number: 4,754,371

[45] Date of Patent: Jun. 28, 1988

[54] LARGE SCALE INTEGRATED CIRCUIT PACKAGE

[75] Inventors: Mitsuru Nitta; Tatsuo Satoh; Tatsuo Inoue, all of Tokyo, Japan

[73] Assignee: NEC Corporation, Tokyo, Japan

[21] Appl. No.: 724,587

[22] Filed: Apr. 18, 1985

[30] Foreign Application Priority Data

Apr. 27, 1984 [JP] Japan .................................. 59-83810
Nov. 22, 1984 [JP] Japan ................................ 59-247123

[51] Int. Cl.⁴ ............................................. H05K 1/09
[52] U.S. Cl. ...................................... 361/411; 174/36;
174/68.5; 361/408; 361/414
[58] Field of Search ............... 361/411, 408, 412, 414;
174/68.5, 36, 52 FP; 420/507; 228/180.2,
263.19; 219/85 H

[56] References Cited

U.S. PATENT DOCUMENTS

| | | | |
|---|---|---|---|
| 3,472,653 | 10/1969 | Short | 420/507 |
| 3,519,890 | 7/1970 | Ashby | 361/408 |
| 3,568,000 | 3/1971 | D'Aboville | 361/414 |
| 3,579,312 | 5/1971 | Short | 420/507 X |
| 3,740,678 | 6/1973 | Hill | 174/68.5 |
| 3,742,597 | 7/1973 | Davis | 174/68.5 |
| 3,855,693 | 12/1974 | Umbaugh | 361/408 X |
| 4,176,443 | 12/1979 | Iannuzzi et al. | 228/180.2 X |
| 4,322,778 | 3/1982 | Barbour et al. | 361/414 X |
| 4,328,531 | 5/1982 | Nagashima et al. | 174/68.5 |
| 4,396,140 | 8/1983 | Jaffe et al. | 228/180.2 X |
| 4,498,122 | 2/1985 | Rainal | 174/68.5 X |
| 4,648,179 | 3/1987 | Bhattacharyya et al. | 174/68.5 X |

FOREIGN PATENT DOCUMENTS

| | | | |
|---|---|---|---|
| 1167162 | 4/1964 | Fed. Rep. of Germany | 420/507 |
| 53-077857 | 10/1978 | Japan | 219/85 H |
| 58100993 | 10/1981 | Japan | 219/85 H |

OTHER PUBLICATIONS

Teresawa et al., A Comparison of Thin Film, Thick Film and Co-Fired High Density Ceramic Multilayer with the Combined Technology, Int. J. for Hybrid Microelectronics, V. 6, #1, Oct. 1983, pp. 607-615.

Semi-Alloys Tech. Bull., #89, Gold Joining Alloys, 5 pages, Jul. 1968.

Primary Examiner—R. R. Kucia
Attorney, Agent, or Firm—Burns, Doane, Swecker & Mathis

[57] ABSTRACT

A large scale integrated circuit package is described wherein insulating layers of an organic material are provided between wiring layers to reduce the characteristic impedance of signal wiring. To avoid deformation of the organic insulating layers and subsequent damage to wiring layers, leads for connecting the circuits of an integrated circuit chip to electrode pads are mechanically connected to the electrode pads on an upper layer of organic insulating material by a gold-tin eutectic alloy.

6 Claims, 3 Drawing Sheets

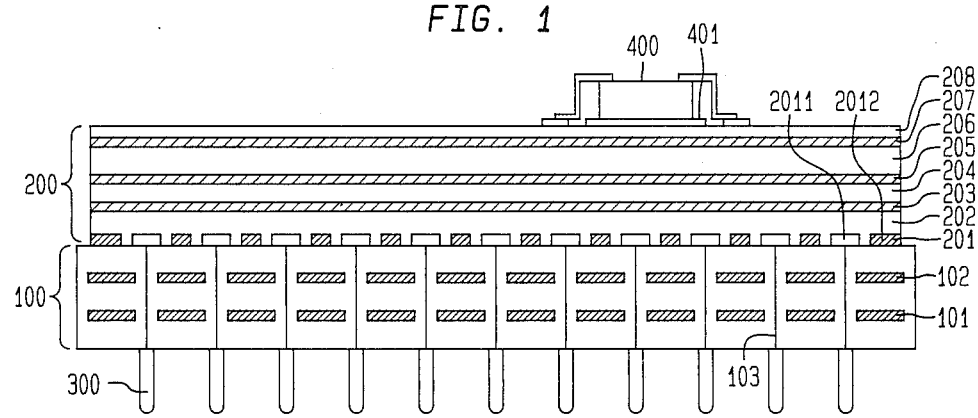

LARGE SCALE INTEGRATED CIRCUIT PACKAGE

BACKGROUND OF THE INVENTION

The present invention relates to a large scale integrated circuit (IC) package mounted with a plurality of IC chips.

One example of conventional large scale integrated circuit (LSI) packages is proposed in a paper entitled "A Comparison of Thin Film, Thick Film, and Co-Fired High Density Ceramic Multilayer with the Combined Technology: T&T HDCM" by Dr. M. Terasawa et al., published in the The International Journal for Hybrid Micro-electronics, Vol. 6, No. 1, October 1983, Pages 607 to 615. Since the alumina ($Al_2O_3$) ceramic substrate in such a conventional package is formed by laminating and sintering alumina green sheets, it can be made no thinner than 0.1 to 0.3 mm. As a result, the characteristic impedance of signal wiring cannot be reduced below a certain limit value. Therefore, if the impedance of circuit elements to be mounted is below this limit value, it will be impossible to achieve impedance matching and invite a deterioration in crosstalk characteristic. Another disadvantage is that those ICs mounted on the LSI package might cause the characteristic impedance of the signal wiring to deviate from its designed value.

Furthermore, an organic material used for the insulating layer of the package is much less hard than an inorganic material. Consequently, if wires for connection to IC's and the like are connected to pads on the substrate by a thermal compression bonding technique, which involves the application of a high temperature and high pressure, denting or otherwise deforming the organic material is likely to reset and make normal bonding impossible. Further, such dent or deformation affects the wiring layer underneath the organic material so that faulty wiring occurs. Accordingly, in this type of package, the IC chips are ordinarily connected by soldering by way of leadless chip carriers (LCCs). The mounting using the LCCs does not allow higher mounting density.

SUMMARY OF THE INVENTION

One object of the invention is, therefore, to provide a package free from the above-mentioned disadvantages of the prior art package.

According to one aspect of the invention, there is provided a package which comprises a ceramic layer section including at least one first power supply wiring layer and at least one first grounding wiring layer; and a plurality of terminals provided on one surface of said ceramic layer section. The package further comprises a signal wiring section including at least one signal wiring layer having a desired wiring pattern, a second power supply wiring layer or a second grounding wiring layer formed over the other face of said ceramic layer section, and a third power supply wiring layer or a third grounding wiring layer. Said at least one signal wiring layer is sandwiched between said second power supply wiring layer or a second grounding wiring layer and said third power supply wiring layer or a third grounding wiring layer through insulating layers.

The package of the invention further comprises at least one integrated circuit chip having a plurality of leads and mounted through an upper insulating layer over said at least one signal wiring layer; and a plurality of pads so formed on said upper insulating layer as to electrically connect said at least one integrated circuit chip and said at least one signal wiring layer. Each of the pads is mechanically connected through gold-tin eutectic alloy to a corresponding one of said leads.

BRIEF DESCRIPTION OF THE DRAWINGS

Other features and advantages of the invention will be made more apparent by the detailed description hereunder when taken in conjunction with the accompanying drawings, wherein:

FIG. 1 is a cross-sectional view illustrating a preferred embodiment of the invention;

In the drawings, the same reference numerals represent the same structural elements.

DETAIL DESCRIPTION OF A PREFERRED EMBODIMENT

Figure 2A:
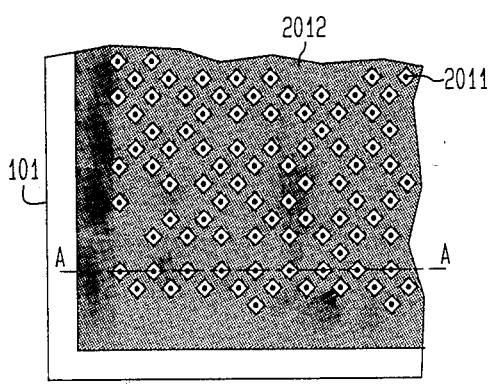
FIGS. 2A to 2F are plan views of different patterns of grounding or power supply wiring.
Figure 2B:
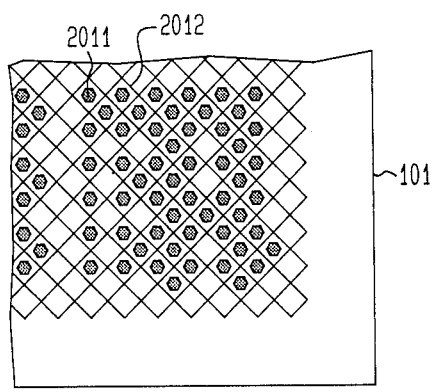
Figure 2C:
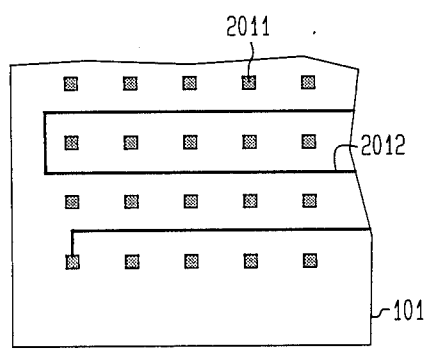
Figure 2D:
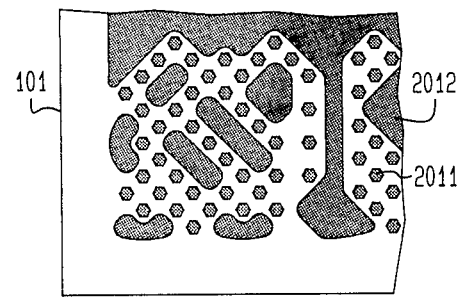
Figure 2E:
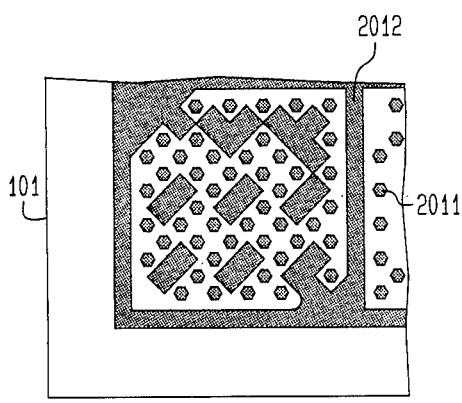
Figure 2F:
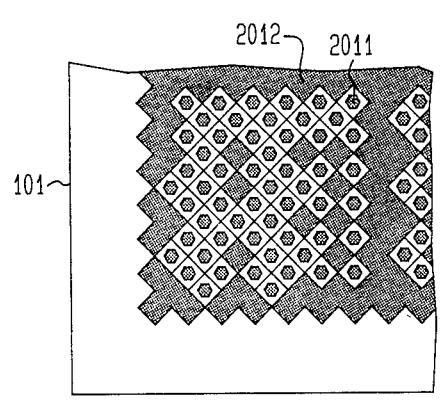

Referring to FIG. 1, a preferred embodiment of the present invention comprises a ceramic layer section 100 formed by laminating green sheets, a plurality of pin-shaped signal input/output terminals 300 provided on the lower surface of the section 100, a wiring layer section 200, and a plurality of IC chips (only one chip 400 is representatively shown in FIG. 1) mounted on the section 200 through a corresponding die bonding pads (only one pad 401 is representively shown in FIG. 1). The section 100 has within itself at least one first power supply wiring layer 101 made of molybdenum or tungsten, and at least one first grounding wiring layer 102 made of molybdenum or tungsten. The layer 101 is connected to pin-shaped terminals for power supply (not shown) by way of through-hole wiring (not shown). The pin-shaped terminals for power supply, like the terminals 300, are provided on the lower surface of the section 100. The IC chip 400 is supplied with power from the layer 101 via the section 200. Similarly, the layer 102 is also connected to pin-shaped terminals for grounding (not shown) to provide the IC chip 400 with a ground potential. The section 200 includes a second power supply wiring layer 201 having a plurality of signal pads 2011 and power supply wiring 2012 formed over the ceramic layer section 100 by using either thick film or thin film technology, a first signal wiring layer 203 formed over the wiring layer 201 through a first polyimide insulating layer 202, a second signal wiring layer 205 formed over the wiring layer 203 through a second polyimide insulating layer 204, a second grounding wiring layer 207 formed over the wiring layer 205 through a third polyimide insulating layer 206, and a fourth polyimide insulating layer 208 formed over the wiring layer 207. As the material for each insulating layer, epoxy or Teflon can be used as well as polyimide. The layers 203 and 205 are formed of either gold or copper in desired wiring patterns by using the thin film technology, and achieve electric connection between the IC chips and between each IC chip and a desired terminal(s) 300. The pads 2011 are connected to the corresponding terminals 300 by corresponding through-hole wiring 103 and to desired parts of the desired signal wiring layers by via-fill wiring (not shown).

In this embodiment, the ceramic layer section 100 and the insulating layer 202 are electromagnetically shielded against each other because of the presence of the power supply wiring layer 201 between them. As a result, the effective specific dielectric constant ϵre; in the signal wiring layers 203 and 205 is unaffected by the specific dielectric constant of the ceramic and becomes substantially equal to that of the polyimide constituting the insulating layer 202. The signal propagation delay time Td (ns/m) in the layers 203 and 205 is generally represented by the following equation:

$$Td = 3.335\sqrt{\epsilon re}$$

Thus, as the above equation indicates, the propagation delay time Td shortens with a decrease in effective dielectric constant ϵre. Therefore, it is evident that the use of polyimide or the like, whose dielectric constant ϵre is low, as the material of the insulating layer will help reduce the propagation delay of signals. Similarly, the grounding wiring layer 207 has the effect of preventing objects present in the vicinity of the upper part of the wiring layer section 200 from causing variations in the effective specific dielectric constants of the wiring layers 203 and 205. Further, since the signal wiring layers 203 and 205 are covered by the grounding wiring layer 207 and the power supply wiring layer 201, the characteristic impedance of the layers 203 and 205 can be readily controlled with the distance between the layers 207 and 201 which are grounded in the form of either an alternately current or a direct current. Accordingly, the characteristic impedance of the layers 203 and 205 can be readily made identical with their respectively designed values. For instance, as the layer 207 is positioned closer to the layers 203 and 205, the characteristic impedance of them declines, resulting in reduced crosstalk noise between signal lines.

A similar effect can be achieved by using the layers 201 and 207 as a grounding wiring layer and a power supply wiring layer, respectively, both the layers 201 and 207 as grounding wiring layers, or both the layers 201 and 207 as power supply wiring layers. Polishing the upper surface of the ceramic layer section 100 before forming the signal wiring layer 201 thereon makes it possible to form the wiring pattern of the layer 201 in an extremely high degree of precision so that the control of the characteristic impedance of the layers 203 and 205 is thereby facilitated.

The wiring layer section 200 may also be formed after forming an additional insulating layer, consisting of polyimide or some other organic material, over the ceramic layer section 100.

Various wiring patterns, as illustrated in FIGS. 2A to 2F, are conceivable for layers 201 and 207. FIG. 1 represents an A—A cross section view of FIG. 2A.

Figure 3:
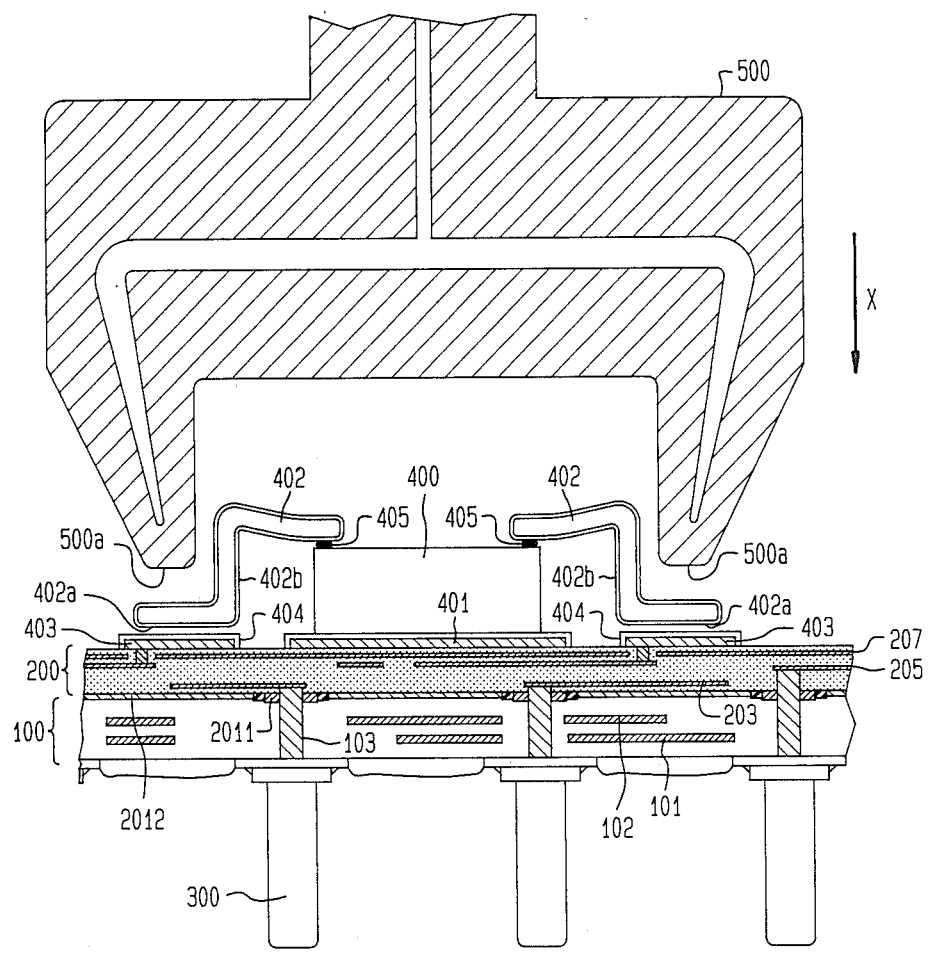
FIG. 3 is an enlarged cross-section view of the area around an IC chip shown in FIG. 1.

The mounting structure of the IC chip 400 is illustrated in detail in FIG. 3. On the wiring layer section 200 are formed die bonding pads 401 and electrodes 403. On the surfaces of the electrodes 403 are formed tin plating films 404. Leads 402 are mechanically so connected to the IC chip 400 as to be electrically connected to circuits within the IC chip 400 in connection portions 405. Over the surfaces of the leads 402, including bonding regions 402a, are formed gold plating films 402b. First, the IC chip 400 is fixed on the pad 401 on the section 200. At this time, the bonding regions 402a of the leads 402 are placed in positions opposite to the electrodes 403, respectively. Next, by moving a bonding tool 500 in the direction indicated by an arrow X, the leads 402 are pressured to bring the films 402b into contact with the films 404. At this time, tips 500a of the tool 500 are in contact with the films 402b on the leads 402. By heating the films 402b and the films 404 through the tool 500, there is formed gold-tin alloy layers between the leads 402 and the electrodes 403. In this case, heating beyond the melting point of tin, i.e., 232° C. (degrees centigrade), melts the tin plating films 404 and diffuses gold atoms from the gold plating films 402b into the tin plating film 404. Further heating to or beyond 269° C., which is the eutectic temperature of gold and tin, results in a mixture of gold and tin crystals stable for practical purposes.

Thus, in this embodiment, the connection of each electrode 403 and corresponding lead 402 is achieved by the formation of an alloy layer by heating, and the application of an excessively high pressure to the electrodes 403 which would be required for connection by the conventional thermal compression bonding method is avoided. As a result, polyimide or some other relatively soft material can be used for the wiring layer section 200.

While this invention has thus for been described in conjunction with the preferred embodiment thereof, it will now readily be possible for those skilled in the art to put this invention into practice in various other manners.

What is claimed is:

1. A large scale integrated circuit package, comprising:
    a ceramic layer section having first and second surfaces and including at least one power supply wiring layer and at least one first grounding wiring layer;
    a plurality of terminals provided on the first surface of said ceramic layer section;
    a wiring layer section disposed on the second surface of said ceramic layer section having at least one signal wiring layer provided with a desired wiring pattern sandwiched between two additional wiring layers, said two additional wiring layers respectively being one of a power supply wiring layer and a grounding wiring layer, and insulating layers separating said at least one signal wiring layer from said two additional wiring layers;
    at least one integrated circuit chip having a plurality of leads and mounted on an upper insulating layer over said at least one signal wiring layer; and
    a plurality of electrodes disposed on said upper insulating layer electrically connected to said at least one signal layer and leads connecting said electrodes to circuits of said integrated chip, the connection between said electrodes and said leads being a gold-tin eutectic alloy.

2. A large scale integrated circuit package as claimed in claim 1, wherein said insulating layers are made of an organic material.

3. A large scale integrated circuit package as claimed in claim 2, wherein said material is selected from the group consisting of polyimide, epoxy and Teflon.

4. A large scale integrated circuit package as claimed in claim 1, and further comprising an organic insulating layer disposed between said ceramic layer section and said wiring layer section.

5. A large scale integrated circuit package as claimed in claim 1, wherein said signal wiring layer is made of either gold or copper.

6. A large scale integrated circuit package as claimed in claim 1, wherein the second surface of said ceramic layer section is polished.

* * * * *